United States Patent [19]

Kaneko et al.

[11] Patent Number: 4,589,096

[45] Date of Patent: May 13, 1986

[54] IIL SEMICONDUCTOR MEMORY INCLUDING ARRANGEMENT FOR PREVENTING INFORMATION LOSS DURING READ-OUT

[75] Inventors: Kenji Kaneko, Hachioji; Takahiro Okabe, Nishitama; Minoru Nagata, Kodaira, all of Japan

[73] Assignee: Hitachi, Ltd., Tokyo, Japan

[21] Appl. No.: 476,269

[22] Filed: Mar. 17, 1983

[30] Foreign Application Priority Data

Mar. 17, 1982 [JP] Japan .................................. 57-40786

[51] Int. Cl.$^4$ .............................................. G11C 11/00
[52] U.S. Cl. .................................... 365/154; 365/189
[58] Field of Search ............... 365/154, 174, 189, 190, 365/156, 181

[56] References Cited

U.S. PATENT DOCUMENTS 4,322,820  3/1982  Toyoda ............................. 365/154
4,374,431  2/1983  Ono et al. .......................... 365/174

*Primary Examiner*—Joseph A. Popek
*Attorney, Agent, or Firm*—Antonelli, Terry & Wands

[57] ABSTRACT

A semiconductor memory having memory cells in each of which emitter terminals and first collector terminals of two IIL unit circuits are cross-connected to each other, injector regions and a common emitter region of the two IIL unit circuits are respectively connected to upper and lower word lines, and second collectors of the IIL unit circuits are respectively connected to a pair of bit lines that are respectively connected through load elements to a power source higher in voltage than the lower word line. This serves to hold the bit line potential higher than the lower word line potential to ensure that transistors formed by the second collectors, the emitters and the bases are inversely operated to prevent information loss during a read operation.

5 Claims, 4 Drawing Figures

IIL SEMICONDUCTOR MEMORY INCLUDING ARRANGEMENT FOR PREVENTING INFORMATION LOSS DURING READ-OUT

BACKGROUND OF THE INVENTION

The present invention relates to a semiconductor memory, and more particularly to a memory which achieves a reliable operation by preventing a malfunction when information is read out.

Semiconductor memories are broadly classified into bipolar and MOS semiconductor memories from the viewpoint of the types of elements used, and into the static type and the dynamic type from the viewpoint of how the information is retained. Among these classifications, the bipolar static memories are principally used in the fields in which high speeds are required. One well known type of such bipolar static memories employs integrated injection logic (hereinbelow, written "IIL") for the memory cells.

Japanese Publication of Pat. No. 50-12866 (1975) discloses an example of the memory whose memory cells are constructed of IIL elements.

In the example shown in this Japanese publication, a transistor portion connected to the bit line of the memory cell is operated in its forward direction in a read-out mode. This can lead to a problem that a malfunction occurs in the read-out mode, depending upon the values of the current gain of the transistor and the stray capacitance of the bit line.

SUMMARY OF THE INVENTION

An object of the present invention is to provide a semiconductor memory in which the information field memory cells is not destroyed when read out, and in which it is not necessary to precisely control current gains, so the memory is stable besides having an increased versatility in fabrication.

The present invention is characterized by including a memory cell in which first collector regions of first and second IIL unit circuits each having first and second collector regions are cross-connected to the bases of the opposite IIL unit circuits and in which second output end of the respective IIL unit circuits are connected to pairing bit lines, and by connecting a power source to both the pairing bit lines through load elements, the power source serving to reversely operate transistors which are connected to the second output ends of the first and second IIL unit circuits of the memory cell.

DETAILED DESCRIPTION OF THE INVENTION

In order to facilitate understanding, a prior-art memory cell employing IIL elements will be first explained.

Figure 1:
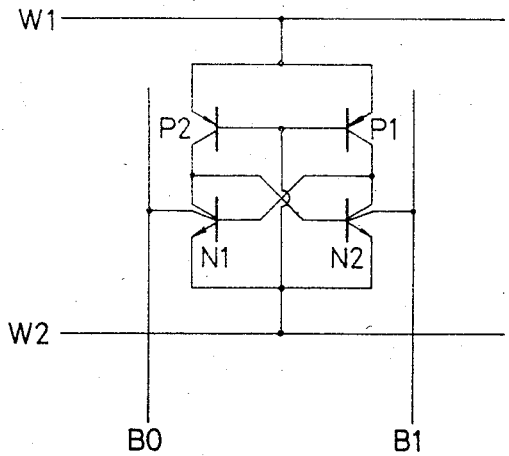
FIGS. 1, 2 and 3 are diagrams showing a prior-art IIL memory.

FIG. 1 shows a hitherto-known member cell circuit which is constructed of IIL elements. Writing and reading methods in the prior art will be first described with reference to FIG. 1. In FIG. 1, transistors P1 and N1 form a first IIL unit circuit, while transistors P2 and N2 form a second IIL unit circuit. The first collectors of the respective transistors N1 and N2 are cross-connected to the bases of the opposite transistors, to construct a flip-flop circuit. Thus, the memory cell retains information. In this memory cell, the emitters of the transistors P1 and P2 are the so-called injectors of the respective IIL unit circuits. These injectors are connected to an upper word line W1. The emitter terminals of the transistors N1 and N2 and the bases of the transistors P1 and P2 are connected to a lower word line W2 in common. A pair of bit lines B0 and B1 are respectively derived from the second collectors (emitters in operation) of the transistors N1 and N2. The first and second collectors are structurally equivalent.

Figure 2:
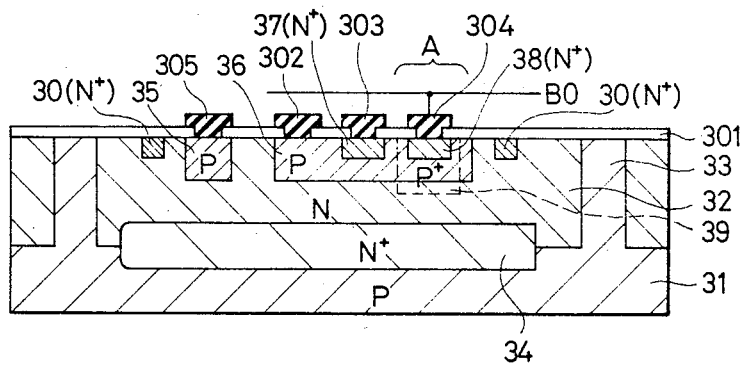

FIG. 2 is a sectional view of the first IIL unit circuit portion composed of the transistors P1 and N1, in the memory cell shown in FIG. 1. It is to be understood that the second IIL unit circuit portion composed of the transistors P2 and N2 is also formed using an arrangement identical to FIG. 2. An N+-type buried layer 34 is formed in the bottom part of an N-type region within a P-type Si substrate 31, while a P-type injector region 35 and a P-type base region 36 (emitter region) are formed in the surface part thereof. N+-type collector regions 37 and 38 are formed in the surface of the P-type base region 36. The regions 35, 32 and 36 constitute the transistor P1 in FIG. 1, while the regions 32, 36, 37 and 38 constitute the transistor N1. The N+-type collector region 38 is connected to the bit line B0 through an electrode 304. The N+-type collector region 37 is connected to the base region of the second IIL unit circuit, not shown, through an electrode 303. The P-type base region 36 is connected to the N+-type collector region of the second IIL unit circuit through an electrode 302. The injector region 35 is connected to the upper word line W1 through an electrode 305. An N+-type region 30 forms the lower word line W2. An insulating layer is also provided, as shown by the numeral 301.

As a memory, such memory cells are arranged in the shape of a matrix. A writing or reading operation is executed by selecting the word lines. In selecting the word lines, the potentials of the word lines W1 and W2 are raised. The writing operation is carried out by selecting the word lines, giving the bit lines B0 and B1 information inverse to each other and extracting current from either transistor. That is, the terminals of the transistors of the memory cell connected to the bit lines are operated as the emitters. On the other hand, the reading operation is similarly carried out by selecting the word lines and then detecting that potential difference between both the bit lines which appears on the basis of current flowing from the memory cell to the bit line.

In the memory cell described above, the transistor constructed of the collector region 37, base region 36 and P-type region 32 (emitter region) is formed in the reverse direction to that of a conventional planar transistor. Therefore, such a transistor is referred to as an "inverse transistor", and the operation of this transistor is called the "inverse operation". Meantime, the collector region 38 actually functions as the emitter, and the transistor constructed of the regions 38, 36 and 32 comes to effect the "forward operation".

Figure 3:
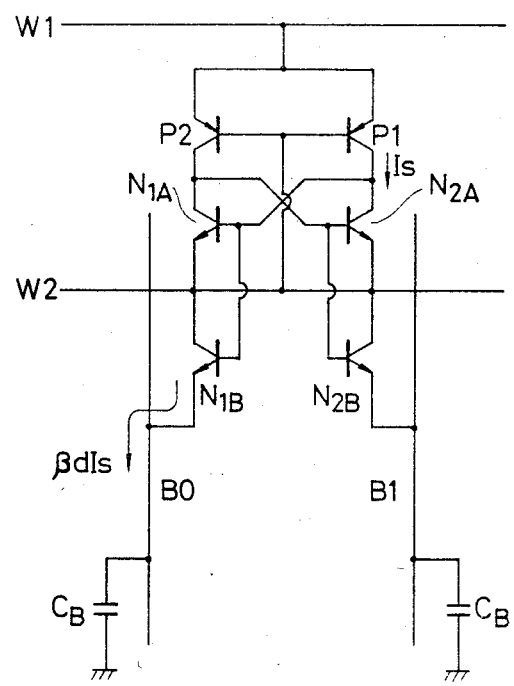

FIG. 3 redraws the memory cell in FIG. 1 in accordance with the actual operations. Here, the transistors N1 and N2 in FIG. 1 are dividedly depicted as transistors N1A and N2A effecting the inverse operations and transistors N1B and N2B effecting the forward operations. Thus, for example, the transistor N1A corresponds to a transistor formed by regions 32, 36 and 37 in FIG. 2, and the transistor N1B corresponds to a transistor formed by regions 32, 36 and 38 in FIG. 2. The transistors N2A and N2B are also formed by a circuit identical to FIG. 2 in the same manner as transistors N1A and N1B.

In the writing operation, the transistor N1B or N2B effects the forward operation, so that a very large current must be extracted through the bit line and the emitter of the transistor N1B or N2B in order to invert the information of the memory cell. That is, letting $I_s$ denote current which is poured per transistor of the memory cell, current in a magnitude not less that $\beta_d I_s$ needs to be extracted from the bit line. Here, $\beta_d$ denotes the current gain of the transistor N1B or N2B which is operating in the forward direction. Since the current gain of the transistor to effect the forward operation is, in general, large, the current to be extracted by the bit line becomes large as mentioned above. Accordingly, when the circuit arrangement is left intact, a large current driving performance is required from a driving circuit for the bit line, and the design for this becomes difficult. Therefore, measures are necessary for lowering the current gains of the transistors N1B and N2B. One common measure for this is to provide a heavily-doped P-type layer 39, as indicated by a broken line in a part A of FIG. 2, in order to lower the current gain by affording a high impurity density and a large base width to the base of the transistor portion which is connected to the bit line.

However, when the current gain has been lowered in this manner, the reading operation becomes unreliable in some cases. In the arrangement of FIG. 3, it is assumed that the base of the transistor N1A is at a high potential, while the base of the transistor N2A is at a low potential. At this time, the potential of the bit line B0 is supposed low, and that of the bit line B1 high. When, under this state, the memory cell of FIG. 3 is selected and the potential of the word line rises, the transistor N1B operates in the forward direction and charges the stray capacitance $C_B$ of the bit line. The transient charging current sometimes results in extracting current from the base of the transistor N1A of the memory cell and bringing this transistor N1A into the "off" state. When the transistor N1A turns into the "off" state, the status of the flip-flop of the memory cell is inverted, so that the information of the memory cell is destroyed. Especially when the stray capacitance $C_B$ is large or when the current gain of the transistor N1B is small, such operation is liable to occur.

Thus, a situation exists where it is desired that the current gain of the transistor N1B as well as N2B be low in the writing mode and high in the reading mode. Obviously, these requirements for the current gain are contradictory. Particularly in the case where the current gain has been lowered, the destruction of the information might arise in the reading mode, and this can become a very serious disadvantage for such a memory. In order to avoid this, the example of the prior art discussed above has needed to precisely control the current gain.

The present invention improves the prior-art memory described above, to avoid this disadvantage without the need for precise current gain control. By utilizing the invention, reliable writing and reading operations are achieved.

The subject matter of the present invention will be first described with reference to an embodiment shown in FIG. 4, wherein identical reference numerals correspond to identical elements shown in FIG. 3.

Figure 4:
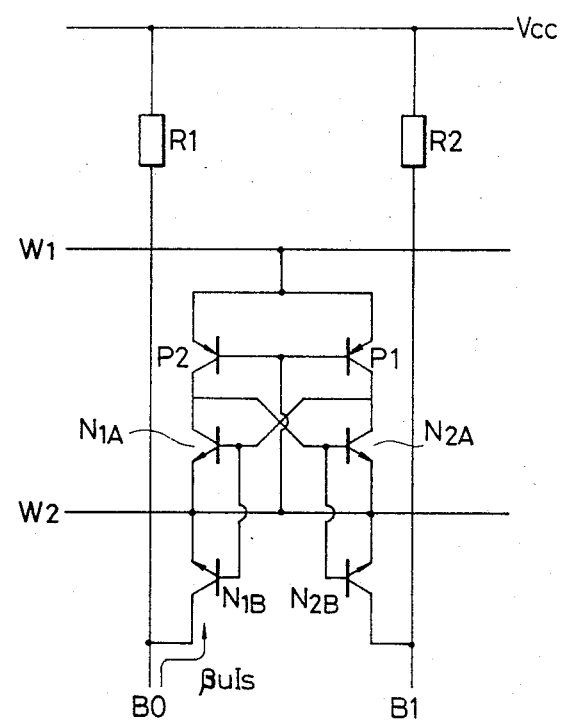
FIG. 4 is a diagram showing an embodiment of the present invention.

The memory cell of the embodiment differs from the prior art illustrated in FIG. 3, in that the parts of the transistors N1B and N2B, which are forward operating in FIG. 3, operate in the reverse direction in FIG. 4. In order to achieve the inverse operations, a power source $V_{cc}$ of positive potential is connected to the bit lines B0 and B1 through load elements R1 and R2 respectively. Since the structure of the memory cell proper is quite the same as that of the prior-art example shown in FIGS. 1 and 2, it is not repeatedly explained.

It has been described as to the prior-art example of FIG. 3 that one of the problems of the prior-art memory is the information destruction in the reading mode. To sum up again here, when the potential of the bit line is low in the reading mode, the transistor N1B or N2B carries out a forward operation, resulting in the destruction of the information of the memory cell. In order to prevent this, accordingly, the potential of the bit line may be always held higher than the potential of the lower word line W2 in the reading mode so as to reversely operate the transistor N1B or N2B. To this end, according to the embodiment of FIG. 4, the load element (such as a resistor or a nonlinear element) is added to each bit line so as to keep the potential of the bit line higher than that of the word line W2. Thus, the transistors N1B and N2B shown in FIG. 3 operate in an inverse manner similar to that of the transistors N1A and N2A illustrated in FIG. 4. No current flows out to each bit line. Instead, current is absorbed from the bit line. Information stored in the memory cell can be read out in accordance with the magnitude of this current.

What is claimed is:

1. A semiconductor memory comprising:
   memory cells each including first and second IIL unit circuits, each of which includes an emitter region of a first conductivity type, a base region of a second conductivity type formed in said emitter region, first and second collector regions of the first conductivity type formed in said base region, and an injector region of the second conductivity type formed in said emitter region and separated from said base region, and in which said first collector regions and said base regions are cross-connected to each other;
   an upper word line connected to said injector regions of said memory cells;
   a lower word line connected to said emitter regions of said memory cells; and
   pairs of bit lines, the bit lines of each pair being respectively connected to said second collector regions of said first and second IIL unit circuits and being respectively connected through load elements to a power source of a predetermined voltage so that said second collector regions operate as collectors and said emitter regions operate as emitters in a reading operation of said memory cells.

2. A semiconductor memory according to claim 1, wherein said each load element is a resistor.

3. A semiconductor memory comprising:
   memory cells each including first and second IIL unit circuits, each of which includes an emitter region of a first conductivity type, a base region of a second conductivity type formed in said emitter region, first and second collector regions of the first conductivity type formed in said base region, and an injector region of the second conductivity type formed in said emitter region and separated from said base region, and in which said first collector regions and said base regions are cross-connected to each other, pairs of bit lines, the bit lines of each pair being respectively connected to said second collector regions of said first and second IIL unit circuits, an upper and a lower word line, said injector regions being connected to said upper word line and said emitter regions being connected to said lower word line, and means coupled to said bit lines for holding said bit lines at a higher potential than said lower word line.

4. A semiconductor memory comprising:

memory cells each including first and second IIL unit circuits, each of which includes an emitter region of a first conducitivity type, a base region of a second conductivity type formed in said emitter region, first and second collector regions of the first conductivity type formed in said base region, and an injector region of the second conductivity type formed in said emitter region and separated from said base region, and in which said first collector regions and said base regions are cross-connected to each other, pairs of bit lines, the bit lines of each pair being respectively connected to said second collector regions of said first and second IIL unit circuits, an upper and a lower word line, said injector regions being connected to said upper word line and said emitter regions being connected to said lower word line, and means coupled to said bit lines for holding said bit lines at a higher potential than said lower word line to inversely operate inverse transistors each of which is formed of said second collector region, said base region and said emitter region to prevent information loss from said memory during readout.

5. A semiconductor memory comprising:

memory cells each including first and second IIL unit circuits, each of which includes an emitter region of n-type conductivity, a base region of p-type conductivity formed in said emitter region, first and second collector regions of n-type conductivity formed in said base region, and an injector region of p-type conductivity formed in said emitter region and separated from said base region, and in which said first collector regions and said base regions are cross-connected to each other;

an upper word line connected to said injector regions of said memory cells;

a lower word line connected to said emitter regions of said memory cells; and pairs of bit lines, the bit lines of each pair being respectivley connected to said second collector regions of said first and second IIL unit circuits and being respectively connected through load elements to a power source of a predetermined voltage which is higher than the voltage of said lower word line so that currents are absorbed from said bit lines into said second collector regions in a reading operation.

* * * * *